(12) United States Patent
Ootsuki

(10) Patent No.: US 6,982,923 B2
(45) Date of Patent: Jan. 3, 2006

(54) SEMICONDUCTOR MEMORY DEVICE ADAPTIVE FOR USE CIRCUMSTANCE

(75) Inventor: Tetsuya Ootsuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 61 days.

(21) Appl. No.: 10/714,210

(22) Filed: Nov. 14, 2003

(65) Prior Publication Data
US 2004/0100856 A1    May 27, 2004

(30) Foreign Application Priority Data
Nov. 15, 2002    (JP) .............................. 2002-332826

(51) Int. Cl.
*G11C 8/00*    (2006.01)
(52) U.S. Cl. ................. 365/233; 365/230.06
(58) Field of Classification Search ................ 365/233, 365/195, 189.01, 198.02, 230.02, 189.04

See application file for complete search history.

(56) References Cited

U.S. PATENT DOCUMENTS

| | | | |
|---|---|---|---|
| 4,491,910 A | * | 1/1985 | Caudel et al. .............. 365/233 |
| 5,560,036 A | * | 9/1996 | Yoshida ..................... 712/227 |

FOREIGN PATENT DOCUMENTS

| | | |
|---|---|---|
| JP | 10-504129 | 4/1998 |
| JP | 2000-40363 | 2/2000 |
| JP | 2000-132966 | 5/2000 |
| JP | 2000-268565 | 9/2000 |
| JP | 2001-93280 | 4/2001 |
| JP | 2002-25255 | 1/2002 |

* cited by examiner

*Primary Examiner*—Thong Q. Le
(74) *Attorney, Agent, or Firm*—Scully, Scott, Murphy & Presser

(57) ABSTRACT

In a semiconductor memory device, a plurality of memory cell arrays, and each of them includes a plurality of memory cells in a matrix. A mode control unit outputs a delay control signal, and an instruction execution unit accesses to the plurality of memory cells based on an address and an address buffer control signal supplied externally. A command control unit outputs the address buffer control signal to the instruction execution unit based on a command supplied externally and the delay control signal. The command control unit outputs the address buffer signal in synchronization with a clock signal when the delay control signal is in an inactive state and the command is a write command or a read command in an ordinary operation mode. When the delay control signal is in an active state and the command is the write command in a write instruction delay operation mode, also when the delay control signal is in the active state and the command is the read command in a read instruction delay operation mode.

8 Claims, 10 Drawing Sheets

SEMICONDUCTOR MEMORY DEVICE ADAPTIVE FOR USE CIRCUMSTANCE

BACKGROUND OF THE INVENTION

1. Field of the Invention

The present invention relates to a semiconductor memory device, especially relates to a DDR-SDRAM (Double Data Rate synchronous Dynamic Random, Access Memory)

2. Description of the Related Art

Recently, SDRA operating in synchronization with a clock signal for a main storage of a computer is disclosed in Japanese Laid Open Patent applications (JP-P2000-40363A, JP-P2000-132966A, JP-P2002-025255A, JP-P2000-268565 and JP-P2001-093280: first to fifth conventional examples). In order to improve a data transmitting speed, DDR-SDRAM and DDRII-SDRAM become general; which are characterized by that (1) a 2n-bit pre-fetch method (n is an integer) is adapted and (2) a data is latched in response to a strobe signal instead of a clock signal. In the 2n-bit pre-fetch method, data of twice of the number n of inputted/outputted bits are read and written at a same.

The DDR-SDRAM adapting the 2n-bit pre-fetch method will be described bellow. FIG. 1 shows the circuit configuration of the semiconductor memory device of the first conventional example. A read operation as a memory operation (the memory access) will be described. The semiconductor memory device of the first conventional example is composed of memory cell arrays 1 and 2, row decoder circuits 3 and 4, sense amplifier circuits 5 and 6, an address receiving circuit 7, an address latch circuit 8, an X address buffer circuit 9, a Y-address buffer circuit 10, a command receiving circuit 11, a command decoder circuit 12, a clock receiving circuit 13, a column control circuit 14, a data receiving circuit 15, a data strobe receiving circuit 16, a data latch circuit 17, a write buffer circuit 18, write amplifier circuits 19 and 20 and column decoder circuits 21 and 22. This semiconductor memory device is provided for a computer. A CPU (Central Processing Unit) and a clock generator (both are not shown) are also provided for the computer.

The memory cell array 1 is provided on the side of even and the memory cell array 2 is on the side of odd. Both of the memory cell arrays 1 and 2 include memory cells in a matrix manner N rows and M columns (both of N and M are natural numbers). The N rows in the memory cell array 1 are connected to word lines, respectively. The word lines are connected to the row decoder circuit 3. The M columns in the memory cell array 1 are connected to bit lines, respectively. The bit lines are connects to the sense amplifier circuit 5 and column selection lines CSL. The column selection lines CSL are connects to the column decoder circuit 21. The N rows in the memory cell array 2 are connected to word lines, respectively. The word lines are connects to the row decoder circuit 4. The M columns in the memory cell array 2 are connected to a bit line. The bit lines are connected to the sense amplifier circuit 6 and column selection lines CSL. The column selection lines CSL are connected to the column decoder circuit 22.

The clock receiving circuit 13 inputs a clock signal clock generator to convert to a internal clock signal ICLK, and then outputs the internal clock signal ICLK to the address latch circuit 8, the Y-address buffer circuit 10, the command decoder circuit 12, the column control-circuit 14 and the data latch circuit 17. The address, receiving circuit 7 inputs an address ADD from the CPU and converts to an address CADD in accordance with an internal command, and then outputs the address to the address latch circuits 8 in response to the clock signal CLK. The address latch circuit 8 receives the address CADD from the address receiving circuit 7 in response to the clock signal CLK, and outputs as an address IA to the X-address buffer circuit 9 and Y-address buffer circuit 10 in synchronization with the internal clock signal ICLK.

The command receiving circuit 11 inputs a CSB (chip selection bar) signal, a RASB (row address strobe bar) signal, a CASB (column address strobe bar) signal and a WEB (write enable bar) signal from the, CPU in response to the clock signal CLK. Then, the command receiving circuit 11 inverts these signals into a CCS signal, a CRAS signal, a CCAS signal and a CWE signal to output them to the command decoder circuit 12.

The command decoder circuit 12 inputs the CCS signal, the CRAS signal, the CCAS signal, and the CWE signal and outputs an active Y-address buffer control signal YAL to the Y-address buffer circuit 10 and the column control circuit 14 in synchronization with the internal clock signal ICLK. Also, the command decoder circuit 12 outputs an active Y-address buffer control signal NYAL to the Y-address buffer circuit 10 and the column control circuit 14 synchronization with the next clock of the internal clock signal ICLK. When a CWE signal indicates a write operation, the command decoder circuit 12 outputs an active command signal WBST to the column control circuit 14 in synchronization with the internal clock signal ICLK. Also, when the CWE signal indicates a read operation, the command decoder circuit 12 outputs an inactive command signal WBST to the column control circuit 14 in synchronization with the internal clock signal ICLK.

An X-address buffer circuit 9 inputs an address IA from the address latch circuit 8. When the address IA is X-address (a row address), an address XA is outputted to the row decoder circuits 3 and 4. The row decoder circuits 3 and 4 decode the address XA supplied from the X-address buffer circuit 9 and drive word lines connected to the memory cells of the memory cell arrays 1 and 2 in response to the address XA. The Y-address buffer circuit 10 receives the address IA from the address latch circuit 8 in synchronization with the internal clock signal ICLK, and outputs the address YA to the column decoder circuits 21 and 22 in response to the Y-address buffer control signals YAL and NYAL, when the address IA is a Y-address (a column address).

When a command signal WBST from the command decoder circuit 12 is active, the column control circuit 14 inputs the Y-address buffer control signal YAL, and outputs an active write buffer control signal W0 to the write buffer circuit 18 in response to the Y-address buffer control signal YAL. Also, when the command signal WBST supplied from the command decoder circuit 12 is inactive, the column control circuit 14 inputs the Y-address buffer control signal NYAL, and outputs an active write buffer control signal W0 to the write buffer circuit 18 in synchronization with the internal clock signal ICLK.

The column control circuit 14 outputs an active column selection line control signal YSEL to the column decoder circuits 21 and 22 in response to the Y-address buffer control signals YAL and NYAL. When the command signal WBST is active to indicate a write operation, the column control circuit 14 outputs the active write amplifier control signal WAE in response to the Y-address buffer control signals YAL and NYAL. The column decoder circuits 21 and 22 decode the address YA from the Y-address buffer circuit 10 and drive the column selection line CSL connected to the memory cells of the memory cell arrays 1 and 2 in response to the address YA.

The data receiving circuit 15 receives a data DQ from the CPU in response to the clock signal CLK, and outputs the data DQ as a data CDQ to the data latch circuit 17. The data strobe receiving circuit receives a data strobe DQS in synchronization with the clock signal CLK from the clock generator, and outputs a data strobe CDQS to the data latch circuit 17. The data latch circuit 17 latches the data CDQ from the data receiving circuit 15 in response to the data strobe CDQS, and outputs data IDQ to the write buffer circuit 18 in synchronization with the internal clock signal ICLK. The write buffer circuit 18 outputs a WBUS signal to the write amplifier circuits 19 and 20 in response to light buffer control signal W0 from column control circuit 14. The write amplifier circuits 19 and 20 outputs the WBUS signal outputted from the write buffer circuit 18 as a write input data IO in response to the write amplifier control signal WAE from column control circuit 14. The sense amplifier circuits 5 and 6 supply the bit line with a voltage and amplify the electric potential on the bit lines connected to the memory cell of memory cell arrays 1 and 2, when the word lines have been driven by row decoder circuits 3 and 4.

Next the write operation of the semiconductor memory device of the first conventional example will be described. In the initial operation, the address receiving circuit 7 inputs the X address as an address ADD in synchronization with the clock signal CLK and output the address CADD (address XA), the address latch circuit 8 latches the address CADD in synchronization with the internal clock signal ICLK and output the address CADD (address, XA) as the address IA. Also, the X-address buffer circuit 9 inputs the address IA (address XA) and outputs the address XA to the row decoder circuits 3 and 4, the row decoder circuits 3 and 4 decode the address XA, from the X-address buffer circuit 9 and drive the word lines in accordance with the address XA (the X-address). Moreover, the sense amplifier circuits 5 and 6 supply the bit lines with a voltage and amplify the electric potentials on the bit lines connected to the memory cells of the memory cell arrays 1 and 2, when the word lines have been driven by the row decoder circuits 3, 4.

In case of the write operation, the WEB signal indicates the write operation, and the command receiving circuit 11 inputs the CSB, RASB, CASB, WEB signals in synchronization with the clock signal CLK, then outputs the commands the CCS, CRAS, CCAS, CWE signals to the command decoder circuit 12, and the address receiving circuit 7 inputs the address Y0 as address ADD in synchronization with the clock signal CLK, and outputs the address CADD (address Y0) to the address latch circuit 8. Also, the data receiving circuit 15 inputs a data D0 (even), D1 (odd), D2 (even), D3 (odd) as data DQ in synchronization with the clock signal CLK and outputs the data CDQ (data D0, D1, D2, D3 ), a bust length at this time is 4.

The write operation will be now described bellow referring to FIG. 1 and FIG. 2. The timing when the command receiving circuit 11 inputs the write command in synchronization with the clock signal CLK is supposed to be P0. The clock receiving circuit detects the rising edge of the clock signal CLK when the clock receiving circuit inputs the clock signal CLK at the timing P0, P1, P2, P3, P4, . . . . Then, the clock receiving circuit outputs the internal clock signal ICLK as an one-shot pulse signal at the timing T0, T1, T2, T3, T4, . . . . The data strobe receiving circuit 16 inputs the data strobe DQS in synchronization with the clock signal CLK and outputs the data strobe CDQS to the data latch circuit 17 at the timing P0, P1, P2, P3, P4, . . . . The pulses of the internal clock signal ICLK are outputted to have a time differences of (P0–T0), (P1–T1), (P2–T2) (P3–T3), (P4–T4), . . . from the clock signal CLK.

The data latch circuit 17 receives a data D0 (even) as the data CDQ corresponding to the data DQ in response to the rising edge of data strobe CDQS signal corresponding to DQS signal at the timing P1. A first data latch section (even) (not shown) of the data latch circuit 17 latches the data D0 (even). The data D0 (even) shown in FIG. 2 indicates the data D0 (even). The data latch circuit 17 receives a data D1 as the data CDQ corresponding to the data DQ in response to the falling edge of the data strobe signal CDQS corresponding to the data strobe signal DQS at the timing P1. The second data latch section (odd) (not shown) of the data latch circuit 17 latches the data D1. The data D1 (odd) shown in FIG. 2 indicates the data D1 (odd). The data latch circuit 17 receives a data D2 as the data CDQ corresponding to the data DQ in response to the rising edge of data strobe CDQS corresponding to the data strobe DQS at the timing P2 in the first data latch section (even). The data D2 (even) shown in FIG. 2 indicates the data D2 (even). The data latch circuit 17 receives a data D3 (odd) as the data CDQ corresponding to the data DQ in response to the falling edge of the data strobe CDQS corresponding to the data strobe DQS at the timing P2 in the second data latch section (odd). The data D3 (odd) shown in FIG. 2 indicates the data D3 (odd). The data latch circuit 17 latches the data D0 (even) in the first data latch section and the data D1 (odd) in the second data latch section in parallel to the third data latch section (not shown) of the data latch circuit 17 in response to the rising edge of the internal clock signal ICLK at the timing T2. Then, the data latch circuit 17 outputs the latched data D0 (even) and data D1 (odd) as a data IDQ to the write buffer circuit 18. The data latch circuit 17 latches the data D2 (even) in the first data latch section and the data D3 (odd) in the second data latch section in parallel to the third data latch section of the data latch circuit 17 in response to the rising edge of the, internal clock signal ICLK at the timing T3. Then, the data latch circuit 17 outputs the latched data D2 (even) and data D3 (odd) as a data IDQ to the write buffer circuit 18.

The command decoder circuit 12 inputs the signals CCS, CRAS, CCAS, and CWE from the command receiving circuit 11. The command decoder circuit 12 outputs the active signal WBST (high level) in response to the rising edge of the internal clock signal ICLK at the timing T0 to the column control circuit 14. The command decoder circuit 12 outputs the active Y-address buffer control signal YAL (high level) as the one-shot pulse signal in response to the rising edge of the internal clock signal ICLK at the timing T2 to the Y-address buffer circuit 10 and the column control circuit 14. Then, the command decoder circuit 12 outputs the active Y-address buffer control signal NYAL (high level) as the one-shot pulse signal in response to the rising edge of the internal clock signal ICLK at the timing T3 to the Y-address buffer circuit 10 and the column control circuit 14. The Y-address buffer control signal YAL is the Y-address buffer control signal in the first burst portion, and the Y-address buffer control signal NYAL is the Y-address buffer control signal in the second burst portion. Because the length of the burst is 4, a period from the timing T2 to the timing T4 is the write burst period.

The column control circuit 14 inputs the Y-address buffer control signal YAL (the one-shot pulse signal) at the timing T2, when the signal WBST from the command decoder circuit 12 is active. At this time, the column control circuit 14 outputs the active write buffer control signal W0 (high level) as a start of the burst period to the write buffer circuit 18 in response to the Y-address buffer control signal YAL at the timing T2. The column control circuit 14 inputs the Y-address buffer control signal NYAL (the one-shot pulse signal) at the timing T3, when the signal WBST from the command decoder circuit 12 is active. Then, the column control circuit 14 outputs the inactive write buffer control signal W0 (low level) as an end of the burst period to the write buffer circuit 18 in synchronization with the internal clock signal ICLK at the timing T4.

As mentioned above, the burst period indicates the period during which the write buffer control signal W0 is active (high level). At this time, the write buffer circuit 18 operates as the buffer of data latch circuit 17. The write buffer circuit 18 outputs the data D0 (even) as the signal WBUS to the write amplifier circuit 19 and outputs the data D1 (odd) as the signal WBUS to the write amplifier circuit 20 in the burst period during timing T2 to T3 of the burst period. The write buffer circuit 18 outputs the data D2 (even as the signal WBUS to the write amplifier circuit 19 and outputs the data D3 (odd) as the signal WBUS to the write amplifier circuit 20 in the burst period during timing T3 to T4 of the burst period.

On the other hand, the address latch circuit 8 receives the address CADD (an address Y0) from the address receiving circuit 7 in response to the clock signal CLK at the time P0), and outputs it as an address IA in response to the rising edge of the internal clock signal ICLK at the timing T0. The Y-address buffer circuit 10 latches the address IA (address Y0) supplied from the address latch circuit 8 as the address IA in an address latch section (not shown) of the Y-address buffer circuit 10. According to the 2n-bit pre-fetch method, two kinds of Y-addresses of the address Y0 and the address Y1 are outputted as address YA at the timing T2. The address Y0 is the address corresponding to the column selection line CSL0 of the column selection line CSL connected to the memory cells of memory cell arrays 1 on the side of even. The address Y1 is the address corresponding to the column selection line CSL1 of the column selection line CSL connected to the memory cells of memory cell array 2 on the side of odd. Similarly to the timing T2, two kinds of Y-addresses of the address Y2 and the address Y3 are outputted as address YA at the timing T3. The address Y2 is the address corresponding to the column selection line CSL2 of the column selection line CSL connected to the memory cells of memory cell array 1 on the side of even. The address Y3 is the address corresponding to the column selection line CSL3 of the column selection line CSL connected to the memory cells of memory cell array 2 on the side of odd.

The relation of the address Y0 and the address Y2, the relation of the address Y1 and the address Y3 are indicated by the equation $Y2=Y0+2$ and $Y3=Y1+2$. Therefore, the Y-address buffer circuit 10 outputs the address Y0 (even) as the address YA to the column decoder circuit 21 and outputs the address Y1 (odd) as the address YA to the column decoder circuit 22 in response to the rising edge of the Y-address buffer control signal YAL at the timing T2. The Y-address buffer circuit 10 outputs the address Y2 (even) as the address YA to the column decoder circuit 21 and outputs the address Y3 (odd) as the address YA to the column decoder circuit 22 in response to the rising edge of the Y-address buffer control signal NYAL at the timing T3. The column control circuit 14 outputs the active column selection line control signal YSEL (high level) to the column decoder circuits 21 and 22 and outputs the active write amplifier control signal WAE (high level) to the write amplifier circuits 19 and 20 in response to the Y-address buffer control signal YAL at the timing T2. The column control circuit 14 outputs the active column selection line control signal YSEL (high level) to the column decoder circuits 21 and 22 and outputs the active write amplifier control signal WAE (high level) to the write amplifier circuits 19 and 20 in response to the Y-address buffer control signal NYAL at the timing T3. The column decoder circuit 21 sets a signal transferred through the column selection line CSL0 (even) to an active state (high level) in order to drive the column selection line CSL0 (even) at the timing T2 in response to the column selection line control signal YSEL at the timing T2. The column decoder circuit 22 sets a signal transferred through the column selection line CSL1 (odd) to an active state (high level) in order to drive the column selection line CSL1 (odd) at the timing T2 in response to the column selection line control signal YSEL at the timing T2. The column decoder circuit 21 sets a signal transferred through the column selection line CSL2 (even) to an active state (high level) in order to drive the column selection line CSL2 (even) at the timing T3 in response to the column selection line control signal YSEL at the timing T3. The column decoder circuit 22 sets a signal transferred through the column selection line CSL3 (odd) to an active state (high level) in order to drive the column selection line CSL3 (odd) at the timing T3 in response to the column selection line control signal YSEL at the timing T3.

The write amplifier circuit 19 outputs the signal WBUS (the data D0 (even)) from the write buffer circuit 18 as the write input data IO to the sense amplifier circuit 5 in response to the write amplifier control signal WAE at the timing T2. The sense amplifier circuit 5 outputs the write input data IO (the data D0 (even)) from the write amplifier circuit 19 to the bit line. The write input data IO (the data D0 (even)) is written in the memory cell (address Y0) connected to the bit line.

The write amplifier circuit 20 outputs the signal WBUS (the data D1 (odd)) from the write buffer circuit 18 as the write input data IO to the sense amplifier circuit 6 in response to the write amplifier control signal WAE at the timing T2. The sense amplifier circuit 6 outputs the write input data IO (the data D1 (odd)) from the write amplifier circuit 20 to the bit line. The write input data IO (the data D1 (odd)) is written in the memory cell (address Y1) connected to the bit line. The write amplifier circuit 19 outputs the writes bus WBUS (the data D2 (even)) from the write buffer circuit 18 as the write input data IO to the sense amplifier circuit 5 in response to the write amplifier control signal WAE at the timing T3. The sense amplifier circuit 5 outputs the write input data IO (the data D2 (even)) from the write amplifier circuit 19 to the bit line. The write input data IO (the data D2 (even)) is written in the memory cell (address Y2) connected to the bit line. The write amplifier circuit 20 outputs the writes bus WBUS (the data D3 (odd)) from the write buffer circuit 18 as the write input data IO to the sense amplifier circuit 6 in response to the write amplifier control signal WAE at the timing T3. The sense amplifier circuit 6 outputs the write input data IO (the data D3 (odd)) from the write amplifier circuit 20 to the bit line. The write input data IO (the data D3 (odd)) is written in the memory cell (address Y3) connected to the bit line.

Further next, the read operation the semiconductor memory device of the first conventional example will be described with reference to FIG. 3. The initial operation is same as the write operation. In case of the read operation, the command WEB indicates a read operation. The command receiving circuit 11 inputs the signals CSB, RASB, CASB, and WEB in synchronization with the clock signal CLK, and outputs the signals CCS, CRAS, CCAS, and CWE to the command decoder circuit 12. The address receiving circuit 7 inputs the address Y0 as address ADD in synchronization with the clock signal CLK, and outputs the address CADD (address Y0) to the address latch circuit 8.

Now the read operation will be described bellow referring to FIG. 1 and FIG. 3. The timing when the command receiving circuit 11 inputs the read command in synchronization with the clock signal CLK is supposed to be P0. The clock receiving circuit detects the rising edge of the clock signal CLK when the clock receiving circuit inputs the clock signal CLK at the timing P0, P1, P2, P3, P4, . . . . Then, the clock receiving circuit 11 outputs the internal clock signal ICLK as an one-shot pulse signal at the timing T0, T1, T2, T3, T4, . . . . The internal clock signal ICLK is outputted to have the time difference of (P0–T0), (P1–T1), (P2–T2), (P3–T3), (P4–T4), . . . to the clock signal CLK. The command decoder circuit 12 inputs the signals CCS, CRAS, CCAS, CWE from the command receiving circuit 11. The command decoder circuit 12 outputs the inactive signal WBST (low level) to the column control circuit 14 in response to the rising edge of the internal clock signal ICLK at the timing T0. The command decoder circuit 12 outputs the active Y-address buffer control signal YAL (high level) as the one-shot pulse signal in response to the rising edge of the internal clock signal ICLK at the timing T0 to the Y-address buffer circuit 10 and the column control circuit 14. Then, the command decoder circuit 12 outputs the active Y-address buffer control signal NYAL (high level) as the one-shot pulse signal to the Y-address buffer circuit 10 and the column control circuit 14 in response to the rising edge of the internal clock signal ICLK at the timing T1. The address latch circuit 8 receives the address CADD (an address Y0) from the address receiving circuit 7 in response to the clock signal CLK (the time P0) then, outputs the one as an address IA in response to the rising edge of the internal clock signal ICLK at the timing T0. The Y-address buffer circuit 10 latches the address IA (address Y0) from address latch circuit 8 as the address IA in an address latch section (not shown) of the Y-address buffer circuit 10. Similarly to the write operation, according to the 2n-bit pre-fetch method, two kinds of Y-addresses of the address Y0 corresponding to the column selection line CSL0 and the address Y1 corresponding to the column, selection line CSL1 are outputted as address YA at the timing T0. Also, like the write operation, two kinds of Y-addresses of the address Y2 corresponding to the column selection line CSL2 and the address Y3 corresponds to the column selection line CSL3 are outputted as address YA in the timing T1. Therefore, the Y-address buffer circuit 10 outputs the address Y0 (even) as the address YA to the column decoder circuit 21 and outputs the address Y1 (odd) as the address YA to the column decoder circuit 22 in response to the rising edge of the Y-address buffer control signal YAL at the timing T0. The Y-address buffer circuit 10 outputs the address Y2. (even) as the address YA to the column decoder circuit 21 and outputs the address Y3 (odd) as the address YA to the column decoder circuit 22 in response to the rising edge of the Y-address: buffer control signal NYAL at the timing T1. The column control circuit 14 outputs the active column selection line control signal YSEL (high level) to the column decoder circuits 21 and 22 in response to the Y-address buffer control signal YAL at the timing T0. The column control circuit 14 outputs the active column selection line control signal YSEL (high level) to the column decoder circuits 21 and 22 in response to the Y-address buffer control signal NYAL at the timing T1. The column decoder circuit 21 sets a signal transferred through the column selection line CSL0 (even) to an active state (high level) in order to drive the column selection line CSL0 (even) at the timing T0 in response to the column selection line control signal YSEL at the timing T0. The column decoder circuit 22 sets a signal transferred through the column selection line CSL1 (odd) to an active state (high level) in order to drive the column selection line CSL1 (odd) at the timing T0 in response to the column selection line control signal YSEL at the timing T0. The column decoder circuit 21 sets a signal transferred through the column selection line CSL2 (even) to an active state (high level) in order to drive the column selection line CSL2 (even) at the timing T1 in response to the column selection line control signal YSEL at the timing T1. The column decoder circuit 22 sets a signal transferred through the column selection line CSL3 (odd) to an active state (high level) in order to drive the column selection line CSL3 (odd) at the timing T1 in response to the column selection line control signal YSEL at the timing T1.

As described above, in the semiconductor memory device of the first conventional example the timings of the read operation, timings T0 and T1 at which the command decoder circuit 12 outputs the Y-address buffer control signals YAL and NYAL are earlier than the timings of the write operation by two clocks. That is, in the read operation, the timing of the column selection line CSL to be activated (the timing at which the signal transferred the column selection line CSL becomes active) is earlier than the timing in write operation by two clocks. Therefore, the data of the sense amplifier circuits 5 and 6 activated by the active command are destroyed by the column selection line CSL activated by the read command sometimes depending on the use circumstances (for example, the data length and the burst length). The technique disclosed in Japanese Laid Open Patent Application (JP-A-Heisei 10-504129) is a circuit characterized by the improvement of yield of memory chip by shifting an extra time which can be used for tAA to more critical parameter tRCD. The tAA indicates a duration between the clock to the input of the read command at a setting to CAS LATENCY=1 and the output of all data (all data of eight data in the case of x8) to DQ PAD as in the expectation value. The tAA is used as the index which indicates the efficiency of the chip. The tRCD indicates duration between the clock to the input of active command and the clock to the input of the column command (the write command/read command).

The semiconductor memory device of a second conventional example is characterized by including above-mentioned technique in addition to the technique of the first conventional example FIG. 4 shows a circuit configuration of the semiconductor memory device in the second conventional example. The read operation of the memory operation will be described, like the first conventional example. The semiconductor memory device of the second conventional example is further composed of a mode exchange circuit 23 in addition to the configuration of the first conventional example. The mode exchange circuit 23 is connected to the command decoder circuit 12. The semiconductor memory device of the second conventional example carries out one of an ordinary operation mode and a column address delay operation mode. Whether the ordinary operation mode or the column address delay operation mode is determined in accordance with the use circumstance such as the data length and the burst length and is previously set to the mode exchange circuit 23. The ordinary operation mode indicates the write operation (see FIG. 2), and the read operation (see FIG. 3 of the semiconductor memory device of the first conventional example.

In the ordinary operation mode, the exchange circuit 23 outputs an active column address delay control signal LTAA (low level), to the command decoder circuit 12. In the second conventional example, the write operation and the read operation of the ordinary operation mode are carried out.

In the column address delay operation mode, the exchange circuit 23 output an active column address delay control signal LTAA (high level) to the command decoder circuit 12. In the second conventional example, the write operation and the read operation of the column address delay operation mode are carried out.

Next, the write operation of the column address delay operation mode in the second conventional example will be described. As shown in FIG. 5, the command decoder circuit 12 inputs the signals CCS, CRAS, CCAS, CWE as the write command from the command receiving circuit 11. The command decoder circuit 12 outputs the active signal WBST (high level) to the column control circuit 14 in response to the rising edge of the internal clock signal ICLK at the timing T0. When the column address delay control signal LTAA from the mode exchange circuit 23 is active, the command decoder circuit 12 outputs the active Y-address buffer, control signals YAL and NYAL (high level) to the Y-address buffer circuit 10 and the column control circuit 14 at a timing after a predetermined time, i.e., for the time of tDELAY compared with the ordinary operation mode. The predetermined time tDELAY is shorter than the time between the rising of the clock CLK and the rising of the next clock CLK and it is longer than the time between the rising of the internal clock signal ICLK and the falling of the internal clock signal ICLK. More specifically, in the column address delay, operation mode, the command decoder circuit 12 detects the rising edge of the internal clock signal ICLK at the timing T2 and outputs the active Y-address buffer control signal YAL (high level) to the Y-address buffer circuit 10 and the column control circuit 14 the time tDELAY after the detection. The command decoder circuit 12 detects the rising edge of the internal clock signal ICLK at the timing T3 and outputs the active Y-address buffer control signal NYAL (high level) to the Y-address buffer circuit 10 and the column control circuit 14 the time tDELAY after the detection. Therefore, the timing that the write buffer control signal W0 becomes active (high level) is delayed for the predetermined time tDELAY. Also, the timing that data IDQ (data D0 (even), D1 (odd), D2 (even), D3 (odd)) is outputted as the signal WBUS and the timing that the address YA (address Y0 (even), Y1 (odd),Y2, (even), Y3 (odd) is outputted are delayed for the predetermined time tDELAY. Further, the timing that the column selection line control signal YSEL becomes active (high level) and the timing that the signal transferred through the column selection line CSL (the column selection line CSL0 (even), CSL1 (odd), CSL2 (even), CSL3 (odd)) becomes active (high level) are delayed for the predetermined time tDELAY. Furthermore, the timing that the write amplifier control signal WAE becomes active (high level) the timing that the signal WBUS (the data D0 (even), D1 (odd), D2 (even), D3 (odd)) is outputted as write input data IO, and the timing that the write input data IO (the data D0 (even), D1 (odd), D2 (even), D3 (odd)) is written in the memory cell (addresses Y0, Y1, Y2, and Y3) connected to the bit lines are delayed for the predetermined time tDELAY.

Next, the read operation of the column address delay operation mode in the second conventional example will be described. As shown in FIG. 6, the command decoder circuit 12 inputs the signals CCS, CRAS, CCAS, and CWE as the read command from the command receiving circuit 11. The command decoder circuit 12 outputs the inactive signal WBST (low level) to the column control circuit 14 in response to the rising edge of the internal clock signal ICLK at the timing T0. When the column address delay control signal LTAA from the mode exchange circuit 23 is active, the command decoder circuit 12 outputs the active Y-address buffer control signals YAL and NYAL (high level) to the Y-address buffer circuit 10 and the column control circuit 14 at the timing after the predetermined time, i.e., the time of tDELAY compared with the ordinary operation mode More specifically, in the column address delay operation mode, the command decoder circuit 12 detects the rising edge of the internal clock signal ICLK at the timing T0 and outputs the active Y-address buffer control signal YAL (high level) to the Y-address buffer circuit 10 and the column control circuit 14 the time tDELAY after the detection. The command decoder circuit 12 detects the rising edge of the internal clock signal ICLK at the timing T1 and outputs the active Y-address buffer control signal NYAL (high level) to the Y-address buffer circuits 10 and the column control circuit 14 the time tDELAY after the detection. The command decoder circuit 12 detects the rising edge of the internal clock signal ICLK at the timing T1 and outputs the active Y-address buffer control signal NYAL (high level) to the Y-address buffer circuit 10 and the column control circuit 14 the time tDELAY after the detection Therefore, in the column address delay operation mode, the timing that address YA (the address Y0 (even), Y1 (odd), Y2 (even), Y3 (odd)) is outputted is delayed for the predetermined time tDELAY compared with the ordinary operation mode. Also, the timing that the column selection line control signal YSEL becomes active (high level) and the timing that the signal transferred through the column selection line CSL (the column selection line CSL0 (even), CSL1 (odd), CSL2 (even), CSL3 (odd)) becomes active (high level) is delayed for the predetermined time tDELAY compared with the ordinary operation mode. As a result, data cannot be destroyed in the read operation in the column address delay operation mode of the second conventional example.

Furthermore, because the timing that that the signal transferred through the column selection line CSL becomes active (high level) is delayed compared. with the ordinary operation mode, the tAA path from the sense amplifier circuits 5 and 6 to DQ PAD is delayed for the predetermined time tDELAY compared with the ordinary operation mode. In this way, during the read operation of the column address delay operation mode, the duration between the rising edge of the clock CLK and the activation of the column selection line CSL is increased by the predetermined time tDELAY compared with the ordinary operation mode. These results in that the time tRCD in the column address delay operation mode can be reduced compared with that of the ordinary operation mode by the predetermined time tDELAY, though tAA of the column address delay operation mode is increased compared with the done the ordinary operation mode by the predetermined time tDELAY. Although, the timing that Y-address buffer control signals YAL and NYAL become active (high level) is delayed for the predetermined time tDELAY compared with the ordinary operation mode in the column address delay operation mode, even if during the write operation. That is, during the read operation of the column address delay operation mode, the duration between the rising edge of the clock CLK at the time P0 and the activation of the column selection line CSL is increased by the predetermined time tDELAY compared with the ordinary operation mode. As a result, the time tWR of the column address delay operation mode is also increased compared with the one of the ordinary operation mode. The time tWR indicates the duration from a clock which is a second clock after the input of the write command to a clock to reset the word line, which is a clock to input a pre-charge command.

As described above, the semiconductor memory devices of the first and the second conventional examples do not have flexibility to use circumstance, such as a data length and a burst length.

SUMMARY OF THE INVENTION

Therefore, an object of the present invention is to provide a semiconductor memory device which is adaptable for use circumstance.

An another object of the invention is to fasten the tRCD of the column address delay operation mode comparing with the one of ordinal operation mode, though the tWR is same as the one of the ordinal operation mode.

In an aspect of a semiconductor memory device of the present invention, a plurality of memory cell arrays, and each of them includes a plurality of memory cells in a matrix. A mode control unit outputs a delay control signal, and an instruction execution unit accesses to the plurality of memory cells based on an address and an address buffer control signal supplied externally. A command control unit outputs the address buffer control signal to the instruction execution unit based on a command supplied externally and the delay control signal. The command control unit outputs the address buffer signal in synchronization with a clock signal when the delay, control signal is in an inactive state and the command is a write command or a read command in an ordinary operation mode. When the delay control signal is in an active state and the command is the write command in a write instruction delay operation mode, also when the delay control signal is in the active state and the command is the read command in a read instruction delay operation mode.

Here, the command control unit outputs a command signal of the active state in synchronization, with the clock signal to the instruction execution unit when the command is the write command and outputs a command signal of the inactive state in synchronization with the clock signal to the instruction execution unit when the command is the read command. The instruction execution unit accesses to the memory cell array based on the address, the address buffer control signal and the command signal In this case, the command control unit may include a command decoder circuit which may include a, control unit which inputs the command supplied externally, and outputs the command signal in synchronization with a first clock signal and outputs the address buffer control signal in synchronization with a second clock signal. A delay circuit outputs the address buffer control signal delayed, and a multiplexer circuit selects and outputs one of the address buffer control signal and the address buffer signal delayed by the delay circuit based on the delay control circuit and the command signal to the order execution unit.

Also, the instruction execution unit writes a data based on the address buffer control signal when the command signal is in the active state.

Also, the instruction execution unit reads a data from the address based on the address buffer control signal when the command signal is in the inactive state.

DESCRIPTION OF THE PREFERRED EMBODIMENTS

Hereinafter, a semiconductor memory device of the present invention will be described below with reference to the attached drawings. The semiconductor memory device of the present invention will be described by the DDR-SDRAM adopting a 2n-bit pre-fetch method as an example. Also, in the present invention, same numerals and symbols of the first and second conventional examples are used in the same structure of the present invention. Therefore, the same description as that of the first and second conventional examples is omitted.

Figure 7:
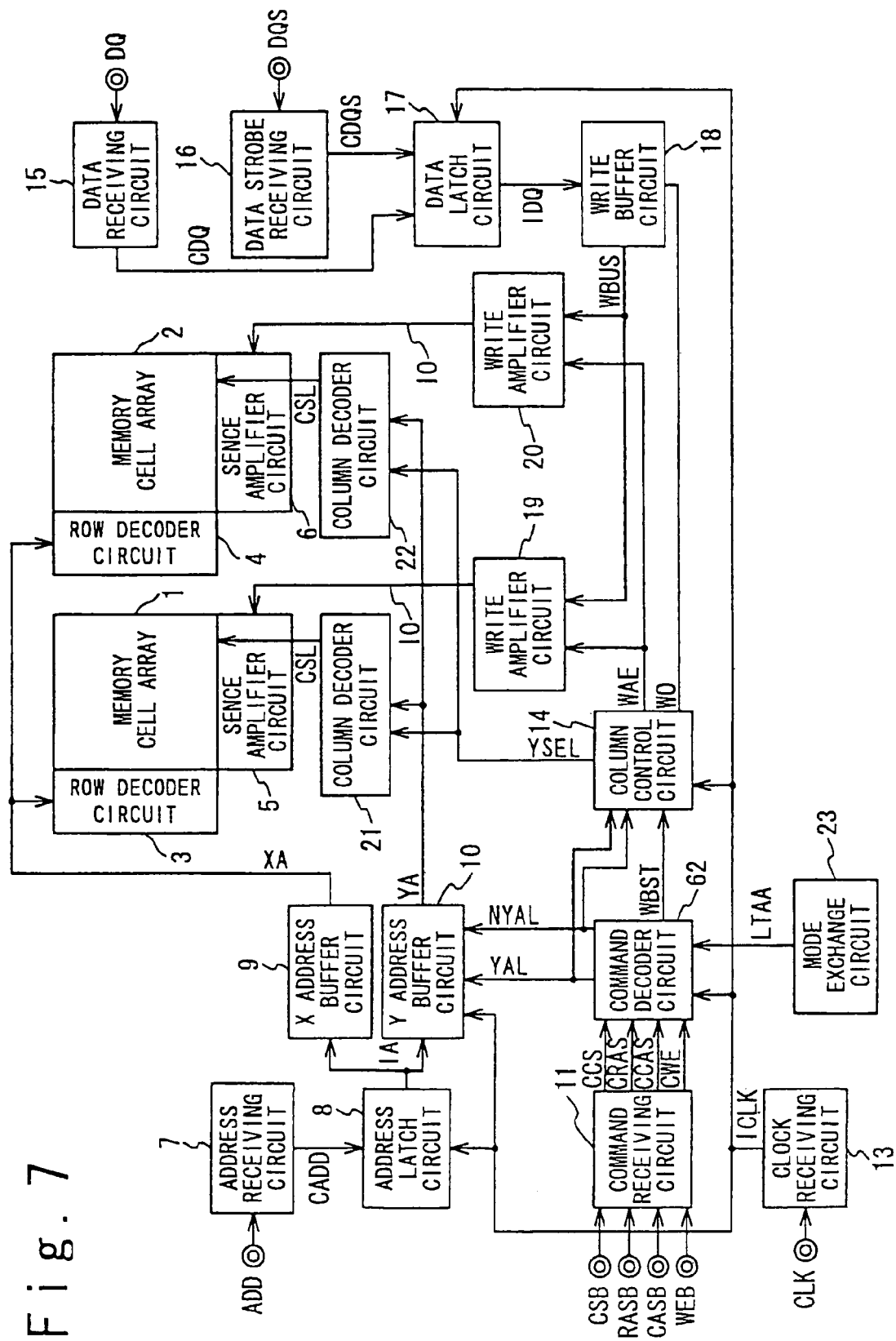
FIG. 7 shows a circuit diagram of the semiconductor memory device of the present invention.

FIG. 7 shows a circuit structure of the semiconductor memory device. In the semiconductor memory device of the present invention shown in FIG. 7, a part of the read operation of the memory operation (the memory access) to the activation of the column selection line CSL will be described. The semiconductor memory device of the present invention is composed of a plurality of memory cell arrays 1 and 2, each of which contains a plurality of memory cells arranged in a matrix, a clock receiving circuit 13, a mode exchange circuit 23 which outputs a column address delay control signal LTAA, an instruction executing section, and a command control section. The semiconductor memory device of the present invention is provided for the same computer in the first and second conventional examples. The instruction executing section inputs an address from the CPU of the computer. The command control section inputs a command from the CPU of the computer. The instruction executing section contains a row decoder circuit 3, a row decoder circuit 4, a sense amplifier circuit 5, a sense amplifier circuit 6, an address receiving circuit 7, an address latch circuit 8, an X-address buffer circuit 9, a Y-address buffer circuit 10, a column control circuit 14, a data receiving circuit 15, a data strobe receiving circuit 16, a data latch circuit 17, a write buffer circuit 18, a write amplifier circuit 19, a write amplifier circuit 20, a column decoder circuit 21, a column decoder circuit 22.

The command control section includes the command receiving circuit 11 and the command decoder circuit 62.

The command decoder circuit 62 will be described below with respect to only the changed point from the command decoder circuit 12.

The command decoder circuit 62 outputs an active signal WBST to the instruction executing section (Y-address buffer circuit 10, the column control circuit 14) in synchronization with an internal clock signal ICLK from the clock receiving circuit 13 when the command is a write command. On the other hand, when the command is a read command, the command decoder circuit 62 outputs a inactive signal WBST to the instruction executing section (the Y-address buffer circuit 10, the column control circuit 14) in synchronization with the internal clock signal ICLK. The command decoder circuit 62 outputs the active Y-address buffer control signals YAL and NYAL to the instruction executing section (Y-address buffer circuit 10, and column control circuit 14) in accordance with a command and a column address delay control signal LTAA from the mode exchange circuit 23. The instruction executing section accesses a plurality of memory cell array 1 and 2 in accordance with the address, the Y-address buffer control signals YAL and NYAL and the signal WBST. This instruction executing section writes a data pinto an address in accordance with the address buffer control signals YAL and NYAL when the signal WBST is in active state. The instruction executing section reads out a data from the address in accordance with Y-address buffer control signals YAL and NYAL when the signal WBST is in the inactive state.

Figure 2:
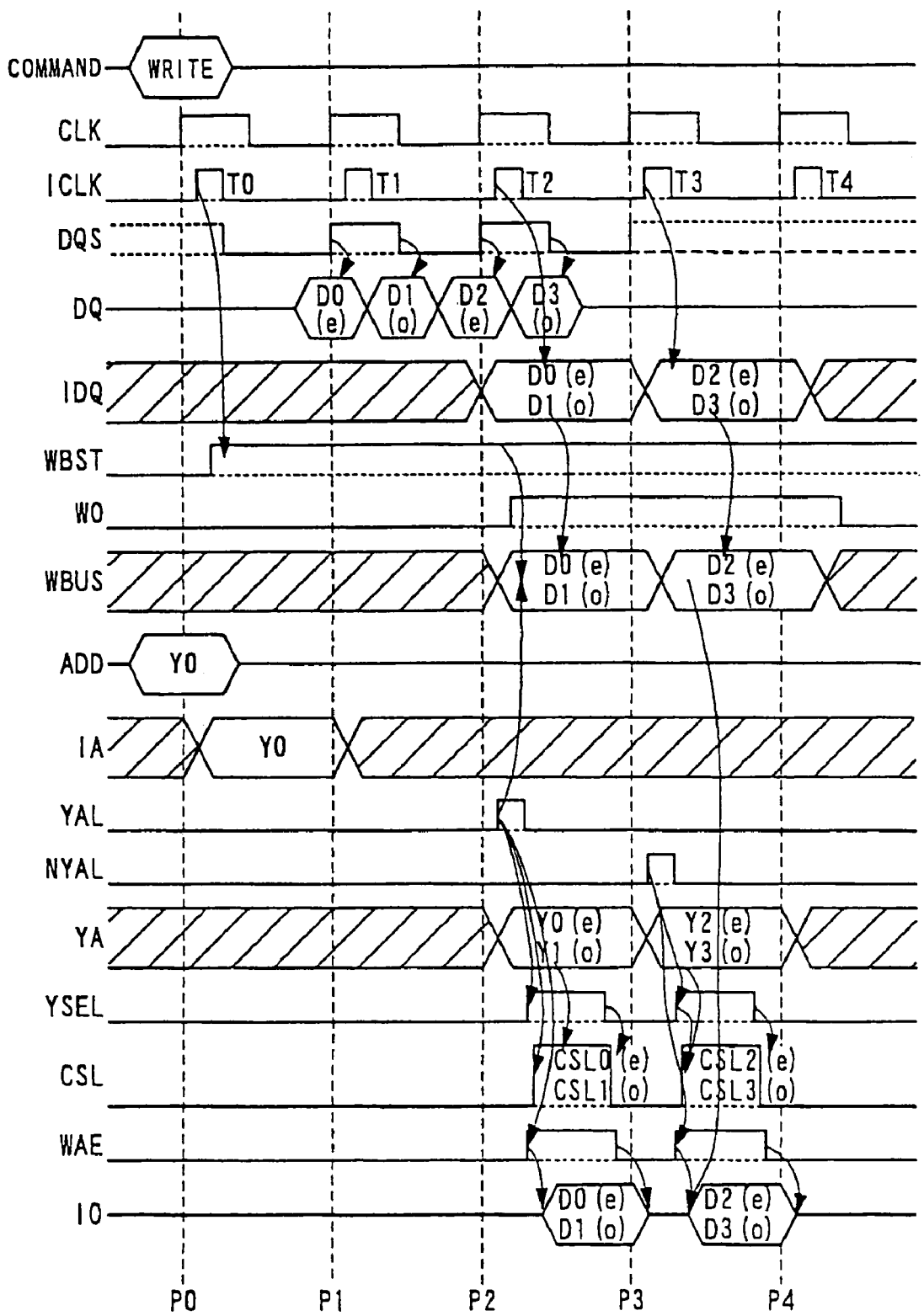
FIG. 2 shows a timing chart of a write operation of the semiconductor memory device of the first conventional example.
Figure 3:
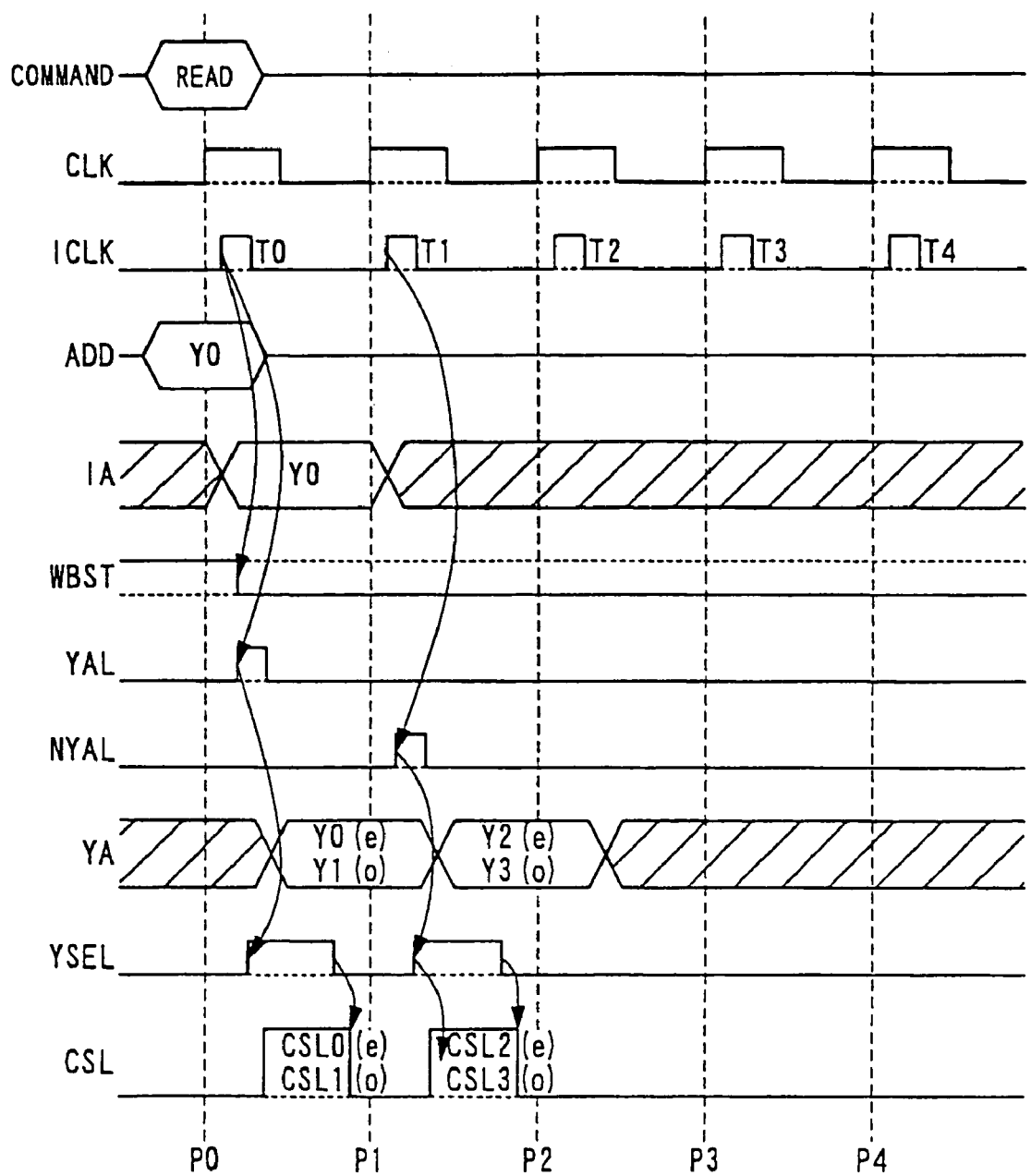
FIG. 3 shows a timing chart of a read operation of the semiconductor memory device of the first conventional example.
Figure 4:
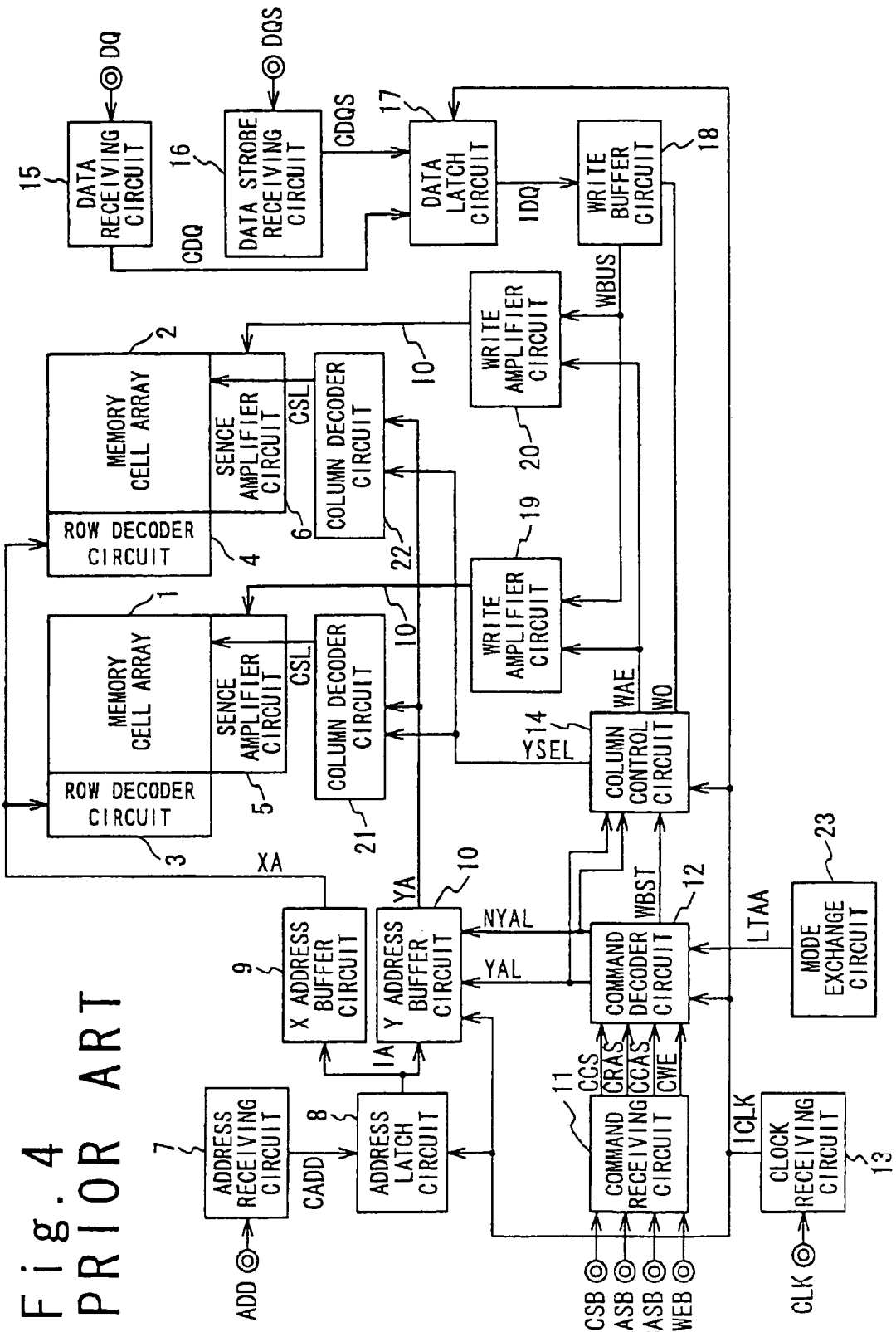
FIG. 4 shows a circuit diagram of the semiconductor memory device of the second conventional example.
Figure 5:
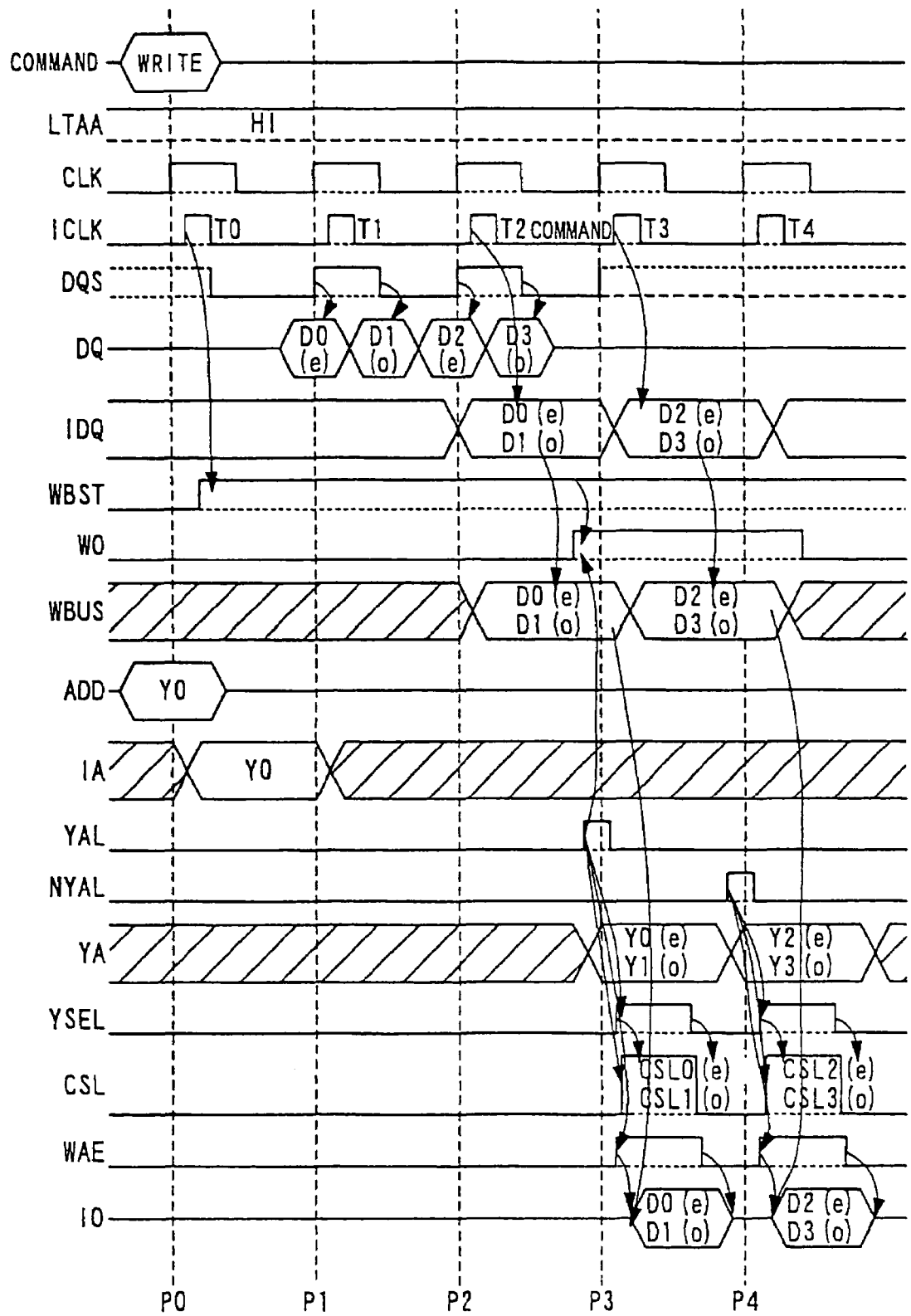
FIG. 5 shows a timing chart of a write operation of the delay operation mode of the semiconductor memory device of the second conventional example.
Figure 6:
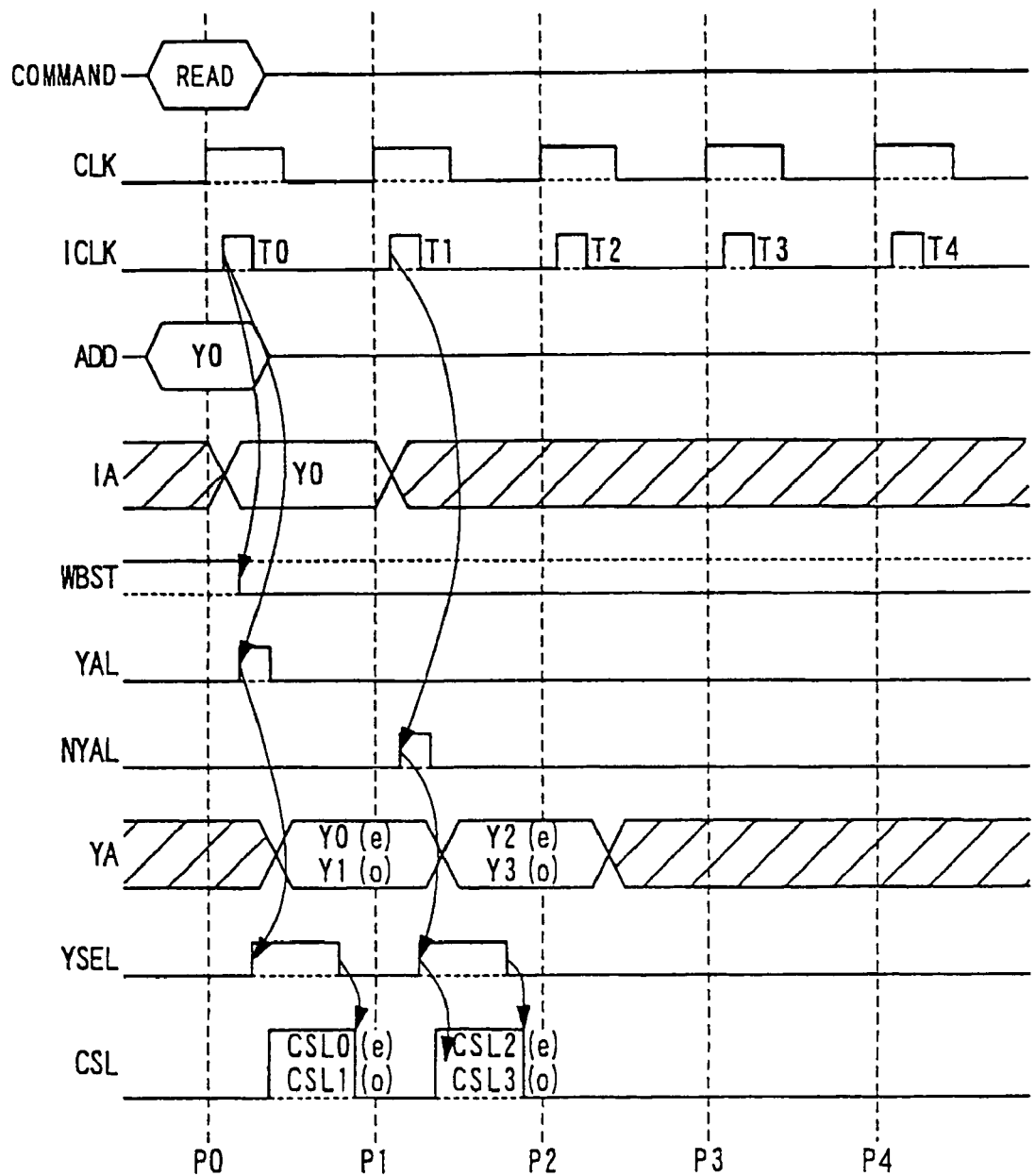
FIG. 6 shows a timing chart of a read operation of the delay operation mode of the semiconductor memory device of the second conventional example.

In the semiconductor memory device of the present invention, like the second conventional example of the semiconductor memory device, one of the ordinary operation mode and the column address delay operation mode is carried out. The selection of the ordinary operation modes and the column address delay operation mode depends on the use circumstance such as a data length and a burst length, which is set in the, modes exchange circuit 23 previously. The ordinary operation mode represents a write operation (shown in the FIG. 2) and a read operation (shown in the FIG. 3) in the above-mentioned first conventional,example. When the ordinary operation mode is selected, the mode exchange circuit 23 outputs the inactive column address delay control signal LTAA (low level) to the command decoder circuit 62. In this case, the semiconductor memory device of the present invention carries out the write operation and the read operation in the ordinary operation mode. When the column address delay operation mode is selected, the mode exchange circuit 23 outputs the active column address delay control signal LTAA (high level) to the command decoder circuit 62. In this case, the semiconductor memory device of the present invention carries out the write operation and the read operation in the column address delay operation mode.

The ordinary operation mode and the column address delay operation mode will be described below.

(1) In the ordinary operation mode, when the column address delay control signal. LTAA is in an inactive state and the command is a write command, the command decoder circuit 62 outputs the active Y-address buffer control signals YAL to the Y-address buffer circuit 10 and the column control circuit 14 in synchronization with the internal clock signal ICLK.

(2) In the ordinary operation mode, when the column, address delay control signal LTAA is in the inactive state and the command is a read command, the command decoder circuit 62 outputs the Y-address buffer control signals YAL to the Y-address buffer circuit 10 and column the control circuit 14 in synchronization with the internal clock signal ICLK.

(3) In the column address delay operation mode, when, column address delay control signal LTAA is in the active state and the command is a write command, the command decoder circuit 62 outputs the active Y-address buffer control signals YAL to the Y-address buffer circuit 10 and the column control circuit 14 in synchronization with the internal clock signal ICLK.

(4) In the column address delay operation mode, when the column address delay control signal LTAA is in the active state and the command is a read command, the command decoder circuit 62 outputs the buffer control signals YAL and NYAL to the Y-address buffer circuit 10 and the column control circuit 14 after to the internal clock signal ICLK by the predetermined time of tDELAY.

Figure 10:
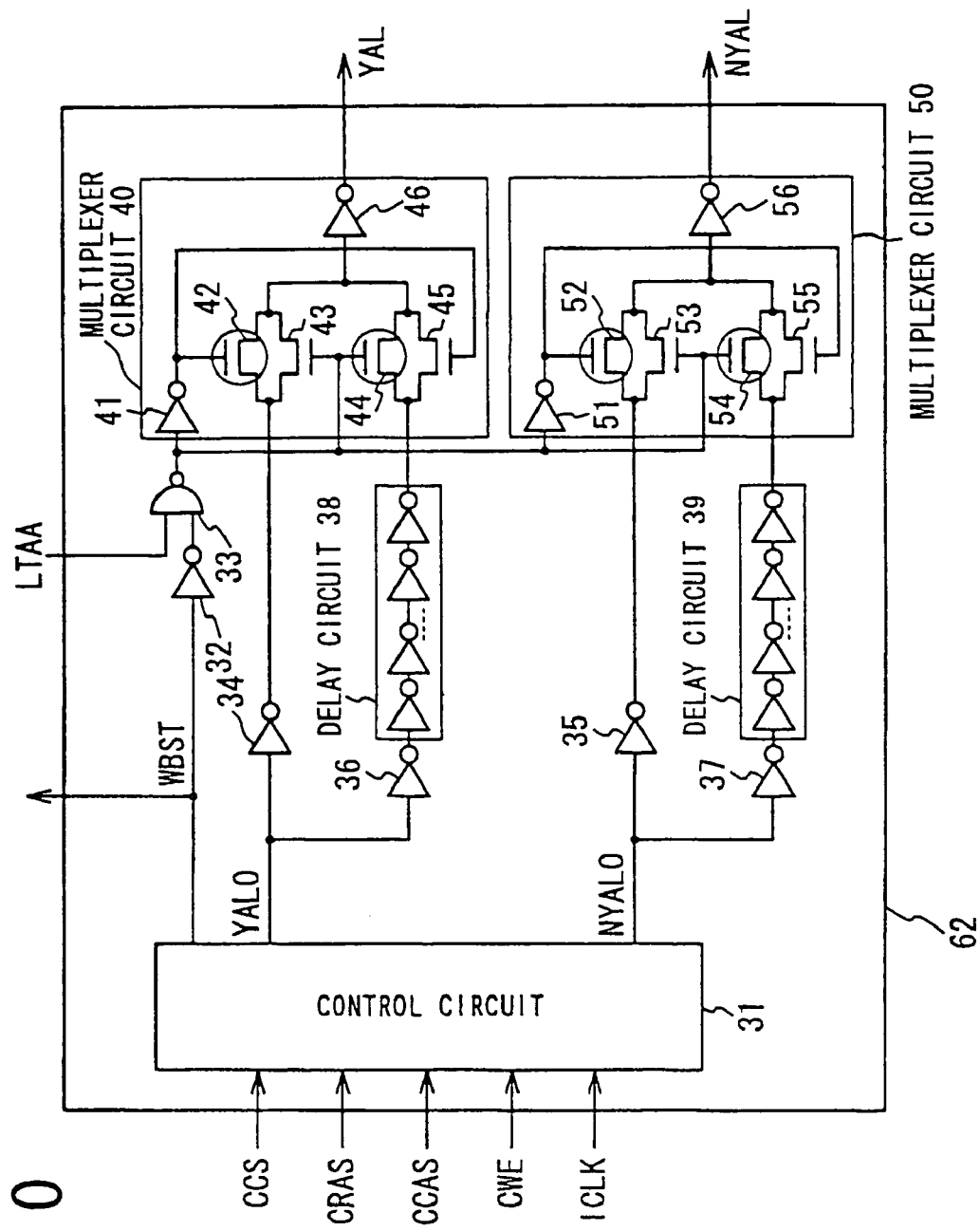
FIG. 10 shows a circuit diagram of the command decoder circuit of the present invention

FIG. 10 shows a structure of above-mentioned command decoder 62. The command decoder 62 is composed of a control circuit 31, an inverter 32, an inverter 34, an inverter 35, an inverter 36, an inverter 37, a NAND circuit 33, a DELAY circuit 38, a DELAY circuit 39, a multiplexer circuit 40, a multiplexer circuit 50. Each of the DELAY circuit 38 and the DELAY circuit 39 is composed of inverters of even number, and the respective inverters are connected in series. The multiplexer circuit 40 is composed of an inverter 41, an inverter 46, a P channel MOS transistor (PMOS transistor) 42 a P. channel MOS transistor (PMOS transistor) 44, a N channel MOS transistor (NMOS transistor) 43, a N. channel MOS transistor (NMOS transistor) 45. The multiplexer circuit 50 is composed of an inverter 51, an inverter 56, a PMOS transistor 52, a PMOS transistor 54, a NMOS transistor 53, and a NMOS transistor 55. The command receiving circuit, the clock receiving circuit 13 and the column control circuit 14 are connected to the control circuit 31 The input terminal of the inverter 32 is connected to the control circuit 31. The output terminal of inverter 32 is connected to one of the two input terminals of the NAND circuit 33. The other input terminal of the NAND circuit 33 is connected to thee mode exchange circuit 23. The output terminal of the NAND circuit 33 is connected to the input terminal of the inverter 41 the gate electrode of NMOS transistor. 43, the gate electrode of PMOS transistor 44, the input terminal of inverter 51, the gate electrode of NMOS transistor 53 and the gate electrode of. PMOS transistor 54. The input terminals of the inverter 34 and the inverter 36 are connected to the control circuit 31. The output terminal of the inverter 34 is connected to the source electrode of the PMOS transistor 42 and the drain electrode of the NMOS transistor 43. The output terminal of the inverter 36 is connected to the input terminal of the receiving inverter of the DELAY circuit 38. The output terminal of the inverter of the last stage of DELAY circuit 38 is connected to the source electrode of the PMOS transistor 44 and the drain electrode of the NMOS transistor 45. The output terminal of the inverter 41 is connected to the gate electrode of the PMOS transistor 42 and the gate electrode of the NMOS transistor 45. The input terminal of the inverter 46 is connected to the drain electrode of the PMOS transistor 42, the source electrode of the NMOS transistor 43, the drain electrode of the PMOS transistor 44 and the source electrode of the NMOS transistor 45. The input terminal of inverter 46 is connected to the Y-address buffer circuit 10 and the column control circuit 14. The input terminals of the inverter 35 and the inverter 37 are connected to the control circuit 31. The output terminal of the inverter 35 is connected to the source electrode of the PMOS transistor 42 and the drain electrode of the NMOS transistor 43. The output terminal of the inverter 37 is connected to the input terminal of the receiving inverter of the DELAY circuit 39. The output terminal of the inverter of the last stage of DELAY circuit 39 is connected to the source electrode of the PMOS transistor 54 and the drain electrode of the NMOS transistor 55. The output terminal of the inverter 51 is connected to the gate electrode of the PMOS transistor 52 and the gate electrode of the NMOS transistor 55. The input terminal of the inverter 56 is connected to the drain electrode of the PMOS transistor 52, the source electrode of the NMOS transistor 53, the drain electrode of the PMOS transistor 54 and the source electrode of the NMOS transistor 55. The input terminal of the inverter 56 is connected to the Y-address buffer circuit 10 and the column control circuit 14.

First of all, the operation of the command decoder 62. (I) in the ordinary operation mode, when the column address delay control signal LTAA is in the active state and a command is the write command, will be described. The mode exchange circuit 23 outputs the active column address delay control signal LTAA (low level "0") to one of the input terminals of the NAND circuit 33 in the command decoder circuit 62. The control circuit 31 inputs the signals CCS, CRAS, CCAS, and CWE as a write command from the command receiving circuit 11, sets the signal WBST (high level "1") to the active state to in accordance with the rising edge of the internal clock signal ICLK from the clock receiving circuit 13 at the timing T0, and outputs to the column control circuit 14 and the input terminal of inverter 32. The inverter 32 changes the signal WBST of "1" to the low level of "0" and outputs to the other input terminal of the NAND circuit 33.

The NAND circuit 33 changes the output signal into the high level of "1" based on the column address delay control signal LTAA of "0" and the command signal WBST of "0", and output to the input terminal of the inverter 41, the gate electrode of the NMOS transistor 43, the gate electrode of the PMOS transistor 44, the input terminal of the inverter 51, the gate electrode of the NMOS transistor 53 and the gate electrode of the PMOS transistor 54. Thus, the PMOS transistor 42, the transistor 52, the NMOS transistor 43, and the NMOS transistor 53 as switches are turned on.

The control circuit 31 outputs the Y-address buffer control signal YAL0 as a one-shot pulse signal (high level "1") to the input terminal of the inverter 34 and the inverter 36 in accordance with the rising edge of the internal clock signal ICLK from the clock receiving circuit 13 at the timing T2. The inverter 34 outputs the Y-address buffer control signal YAL0 of the low level "0" to the drain electrode of the PMOS transistor 42 and the drain electrode of the NMOS transistor 43. At, this time, the Y-address buffer control signal YAL0 of "0" from the inverter 34 is outputted to the input terminal of the inverter 46 through the PMOS transistor 42 and the NMOS transistor 43, because the PMOS transistor 42 and the NMOS transistor 43 are turned on. The inverter 46 inverts the Y-address buffer control signal YAL0 of "0" to high level "1" and outputs it to the Y-address buffer circuit 10 and the column control circuit 14 as the above-mentioned Y-address buffer control signal YAL of "1".

The control circuit 31 outputs the Y-address buffer control signal NYAL0 as the one-shot pulse signal (high level "1") to the input terminals of the inverter 35 and the inverter 37 in accordance with the rising edge of the internal clock signal ICLK from the clock receiving circuit 13 at the timing T3. The inverter 35 outputs the Y-address buffer control signal NYAL0 of the low level "0" to the drain electrode of the PMOS transistor 52 and the drain electrode of the NMOS transistor 53. AT this time, the Y-address buffer control signal NYAL0 of "0" from the inverter 35 is outputted to the input terminal of the inverter 56 through the PMOS transistor 52 and the MOS transistor 53, because the PMOS transistor 52 and the NMOS transistor 53 are turned on. The inverter 56 inverts the Y-address buffer control signal NYAL0 of "0" to high level of "1" and outputs it to the Y-address buffer circuit 10 and the column control circuit 14 as the above-mentioned Y-address buffer control signal NYAL of "1".

Secondly, the operation of the command decoder 62 (II) in the ordinary operation mode, when column address delay control signal LTAA is in the inactive state and a command is the read command, will be described.

The mode exchange circuit 23 outputs the column address delay control signal LTAA of the inactive state (low level "0") to one of the input terminals of the NAND circuit 33 in the command decoder circuit 62. The control circuit 31 inputs the signals CCS, CRAS, CCAS, and CWE as a read command from the command receiving circuit 11, outputs the signal WBST in the inactive state (low level "0") to the column control circuit 14 and the input terminal of the inverter 32 in accordance with the rising edge of the internal clock signal ICLK from the clock receiving circuit 13 at the timing T0. The inverter 32 sets the signal WBST of "0" to the high level of "1" and outputs it to the other input terminal of the NAND circuit 33. The NAND circuit 33 sets the output signal to the high level "1" by the column address delay control signal LTAA of "0" and the command signal WBST of "0" and outputs it to the input terminal of the inverter 41, the gate electrode of the NMOS transistor 43, the gate electrode of the PMOS transistor 44, the input terminal of the inverter 51, the gate electrode of the NMOS transistor 53 and the gate electrode of the PMOS transistor 54. Thus, the PMOS transistor 42, the transistor 52, the NMOS transistor 43, and the NMOS transistor 53 operating as switches are turned on.

The control circuit 31 outputs the Y-address buffer control signal YAL0 as the one-shot pulse signal (high level "1") to the input terminals of the inverter 34 and the inverter 36 in accordance with the rising edge of the internal clock signal ICLK from the clock receiving circuit 13 at the timing T0. The inverter 34 outputs the Y-address buffer control signal YAL0 of the low level "0" to the drain electrode of the PMOS transistor 42 and the drain electrode of the NMOS transistor 43. At this time, the Y-address buffer control signal YAL0"0" from the inverter 34 is outputted to the input terminal of the inverter 46 through the PMOS transistor 42 and the NMOS transistor 43, because the PMOS transistor 42 and the NMOS transistor 43 are turned on. The inverter 46 inverts the Y-address buffer control signal YAL0"0" to the high level of "1" and outputs to the Y-address buffer circuit 10 and the column control circuit 14 as the above-mentioned Y-address buffer control signal YAL of "1". The control circuit 31 outputs the Y-address buffer control signal NYAL0 as the one-shot pulse signal (high level "1") to the input terminals of the inverter 35 and the inverter 37 in accordance with the rising edge of the internal clock signal ICLK at the timing T1. The inverter 35 inverts the Y-address buffer control signal NYAL0 to the low level of "0" and outputs to the drain electrode of the PMOS transistor 52 and the drain electrode of the NMOS transistor 53. At this time, the Y-address buffer control signal NYAL0 of "0" from the inverter 35 is outputted to the input terminal of the inverter 56 through the PMOS transistor 52 and the NMOS transistor 53, because the PMOS transistor 52 and the NMOS transistor 53 are turned on. The inverter 56 inverts the Y-address buffer control signal NYAL0 of "0" to the high level "1" and outputs to the Y-address buffer circuit 10 and the column control circuit 14 as the above-mentioned Y-address buffer control signal NYAL of "1".

Thirdly, the operation (III) of the command decoder 62 in the column address delay operation mode, when the column address delay control signal LTAA is in the active state and a command is the write command, will be described.

The mode exchange circuit 23 outputs the active column address delay control signal LTAA (high level "1") to one of the input terminal of the NAND circuit 33 in the command decoder circuit 62. The NAND circuit 33 sets the output signal to the high level "1" in accordance with the column address delay control signal LTAA of "1" and the command signal WBST of "0" and outputs the output signal to the input terminal of the inverter 41, the gate electrode of the NMOS transistor 43, the gate electrode of the PMOS transistor 44, the input terminal of the inverter 51, the gate electrode of the NMOS transistor 53 and the gate electrode of the PMOS transistor 54. Thus, the PMOS transistor 42, the transistor 52, the NMOS transistor 43, and the NMOS transistor 53 operating as switches are turned on. The following operation is same as the operation (I) and the operation (III).

Finally, the operation (IV) of the command decoder 62 in thee column address delay operation mode, when column address delay control signal LTAA is in the active state and a command is a read command, will be described.

The mode exchange circuit 23 outputs the active column address delay control signal LTAA (high level of "1") to one of the input terminals of the NAND circuit 33 in the command decoder circuit 62. The control circuit 31 inputs the signals CCS, CRAS, CCAS, and CWE as a read command from the command receiving circuit 11, and sets the command signal WBST to the inactive state (low level "0") in accordance with the rising edge of the internal clock signal ICLK from the clock receiving circuit 13 at the timing T0 and outputs to the column control circuit 14 and the input terminal of inverter 32. The inverter 32 sets the signal WBST "0" to the high level "1" and outputs to the other input terminal of NAND circuit 33. The NAND circuit 33 outputs the output signal to the input terminal of the inverter 41, the gate electrode of the NMOS transistor 43, the gate electrode of the PMOS transistor 44, the input terminal of the inverter 51, the gate electrode of the NMOS transistor 53 and the gate electrode of the PMOS transistor 54. In this case, the output signal is set to be the high level of "1" by the column address delay control signal LTAA of "1" and the command signal WBST of "1". Thus, the PMOS transistor 44, the PMOS transistor 54, the NMOS transistor 45, and the NMOS transistor 55 operating as switches are turned on.

The control circuit 31 outputs the Y-address buffer control signal YAL0 as the one-shot pulse signal (high level "1") to the input terminals of the inverter 34 and the inverter 36 in accordance with the rising edge of the internal clock signal ICLK from the clock receiving circuit 13 at the timing T0. The inverter 36 outputs the Y-address buffer control signal YAL0 of the low level "0" to the input terminal of the receiving inverter in the DELAY circuit 38. Each inverter in the DELAY circuit 38 inverts the level of the Y-address buffer control signal YAL0 in order. The time necessary to carry out the inversion corresponds to the former mentioned time "tDELAY".

The final inverter in the DELAY circuit 38 inverts the Y-address buffer control signal YAL0 of "0" to low level "0" and outputs it to the drain electrode of the PMOS transistor 44 and the drain electrode of the NMOS transistor 45. In this case, the Y-address buffer control signal YAL0 of "0" from the DELAY circuit 38 is outputted to the input terminal of the inverter 46 through the PMOS transistor 42 and the NMOS transistor 43, because the PMOS transistor 44 and the NMOS transistor 45 are turned on. The inverter 46 inverts the Y-address buffer control signal YAL0 of "0" to the high level of "1" and outputs it to the Y-address buffer circuit 10 and the column control circuit 14 as the above-mentioned Y-address buffer control signal YAL of "1".

The control circuit 31 outputs the Y-address buffer control signal NYAL0 as the one-shot pulse signal (high level "1") to the input terminal of the inverter 35 and the inverter 37 in accordance with the rising edge of the internal clock signal ICLK at the timing T3. The inverter 37 outputs the Y-address buffer control signal NYAL0 of the low level of "0" to the input terminal of the receiving inverter in the DELAY circuit 38. Each inverter in the DELAY circuit 39 inverts the level of the Y-address buffer control signal NYAL0 in order. The time necessary to carry out the inversion corresponds to the former mentioned time "tDELAY".

The final inverter in the DELAY circuit 38 inverts the Y-address buffer control signal NYAL0 to the low level "0" and outputs it to the drain electrode of the PMOS transistor 54 and the drain electrode of the NMOS transistor 55. At this time, the Y-address buffer control signal NYAL0 of "0" from the DELAY circuit 39 is outputted to the input terminal of the inverter 56 through the PMOS transistor 52 and the NMOS transistor 53, because the PMOS transistor 54 and NMOS transistor 55 are turned on. The inverter 46 inverts the Y-address buffer control signal NYAL0 of "0" to the high level "1" and outputs it to the Y-address buffer circuit 10 and the column control circuit 14 as the above-mentioned Y-address buffer control signal NYAL of "1".

Next, a write operation and a read operation of the column address delay operation mode will be described.

Figure 8:
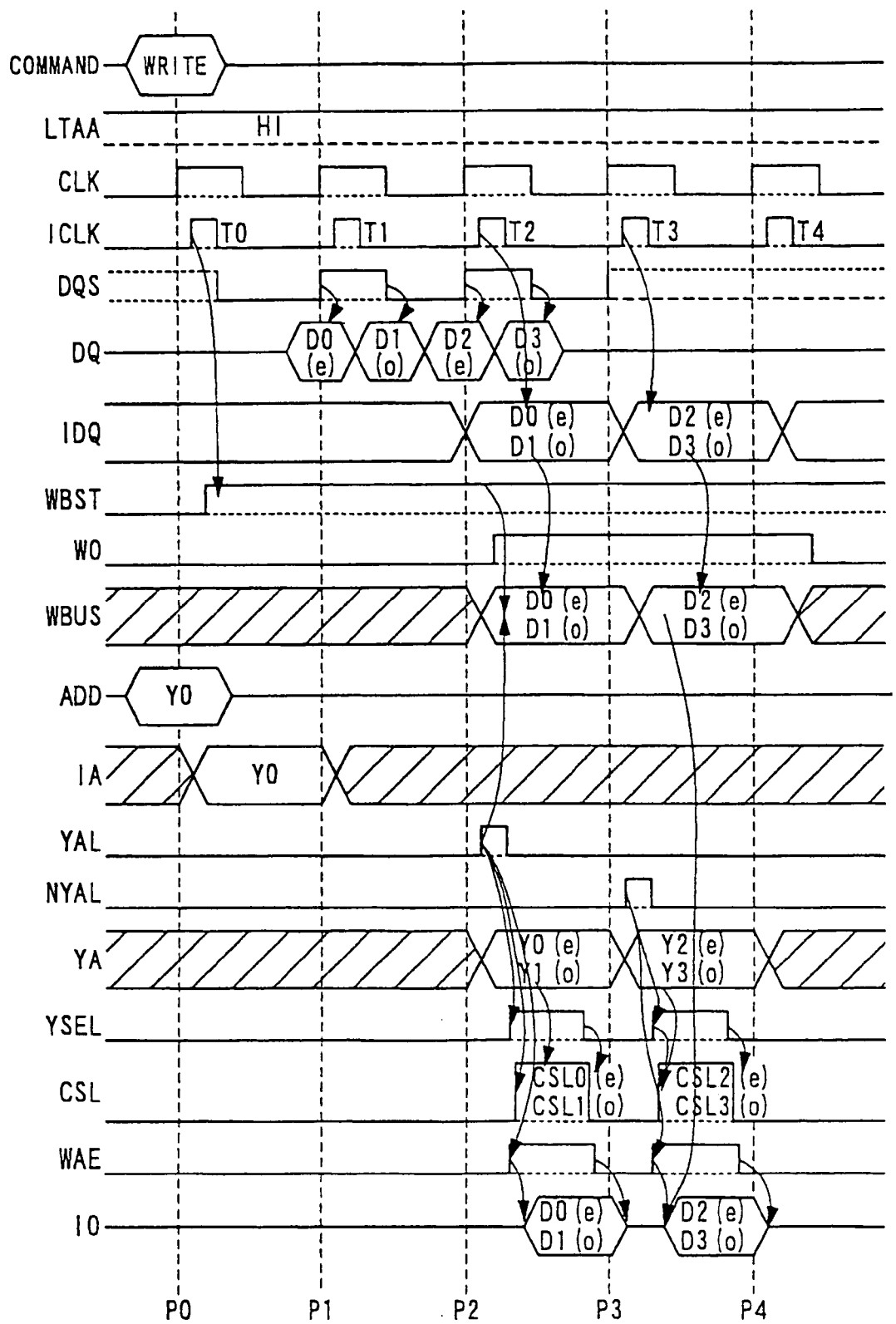
FIG. 8 shows a timing chart of the write operation of the delay operation mode of the present invention.
Figure 9:
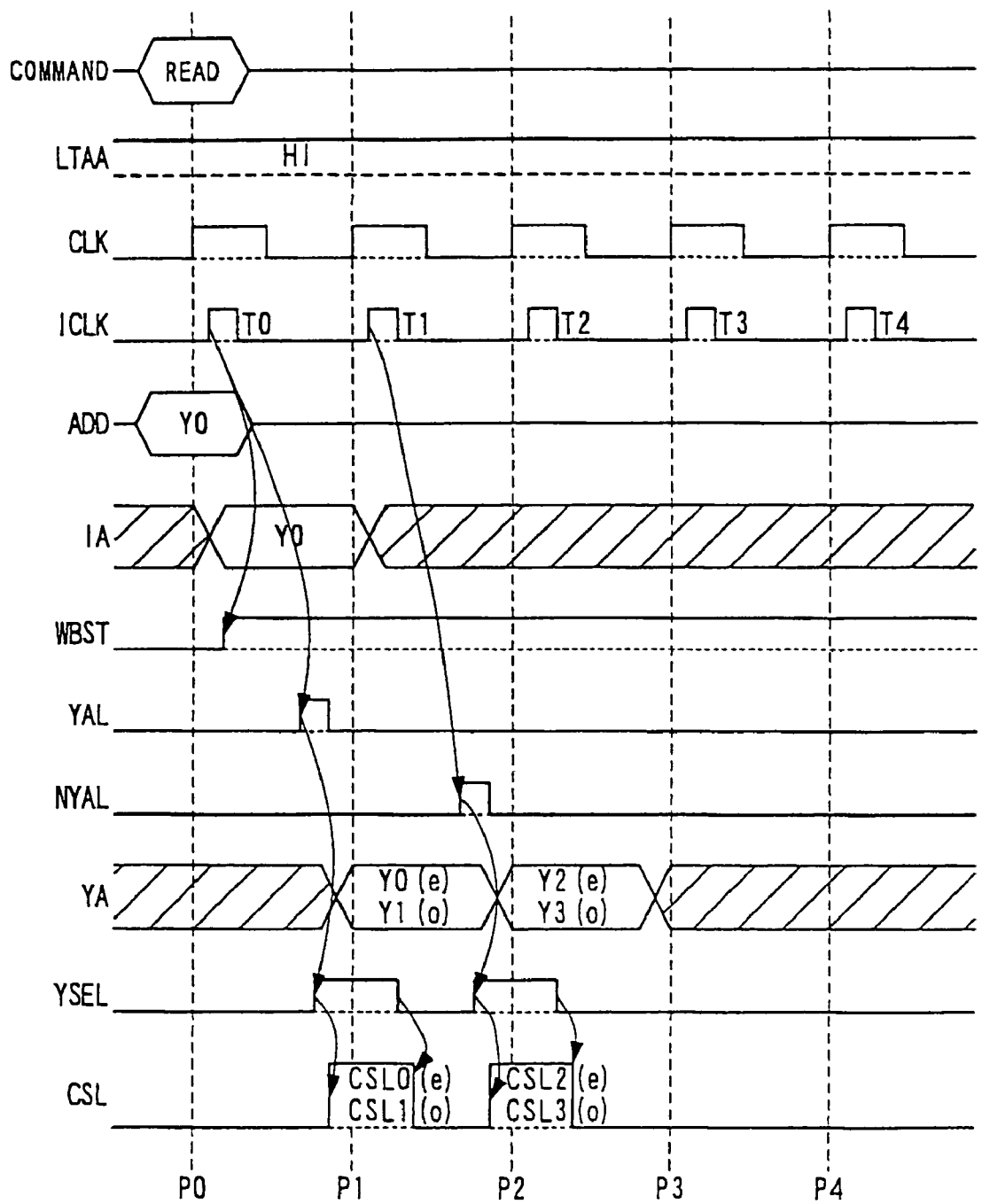
FIG. 9 shows a timing chart of the read operation of the delay operation mode of the present invention.

FIG. 8 is a timing chart showing the write operation of the column address delay operation mode (III) in the semiconductor memory device of the present invention. FIG. 9 is a timing chart showing the read operation of the column address delay operation mode (IV) in the semiconductor memory device of the present invention.

First, the write operation of the column address delay operation mode (III) will be explained bellow. The command decoder 62 inputs the signals CCS, CRAS, CCAS, and CWE as the read command from the command receiving circuit 11, and outputs the signal WBST in the active state (high level) to the column control circuit 14 in accordance with the rising edge of the internal clock signal ICLK at the timing T0. Further, the decoder circuit 62 outputs the Y-address buffer control signal YAL of the active state (high level) as the one shot pulse signal in accordance with the rising edge of the internal clock signal ICLK at the timing T2 to the Y-address buffer circuit 10 and the column control circuit 14, regardless of whether: or not the column address delay control signal LTAA, from the mode exchange circuit 23 is in the active state.

Furthermore, the decoder circuit 62 outputs the Y-address buffer control signal YAL of the active state (high level) as the one-shot pulse signal in accordance with the rising edge of the internal clock signal ICLK at the timing T3 to the Y-address buffer circuit 10 and the column control circuit 14, regardless of whether or not the column address delay control signal LTAA from the mode exchange circuit 23 is in the active state.

After the above-mentioned operation, the same write operation as the ordinary operation mode (I) is carried out.

As above mentioned, in the column address delay operation mode in the semiconductor memory device of the present invention, the timing that Y-address buffer control signals YAL and NYAL become active in the write operation is the same timing as in, the ordinary operation mode. Namely, a time from the timing of the rising edge of clock CLK when the write command is inputted at the timing P0 to the timing when the signal running through a column selection line CSL becomes active (high level) is same as the time in the ordinary operation mode. Therefore, a tWR in the column address delay operation mode is the same as the tWR in the ordinary operation mode. The tWR indicates the time from the timing of two clocks after the clock when the write command is inputted to the basic clock when the word lines are reset.

Second, the read operation of the column address delay operation mode (IV) will be described bellow.

Figure 1:
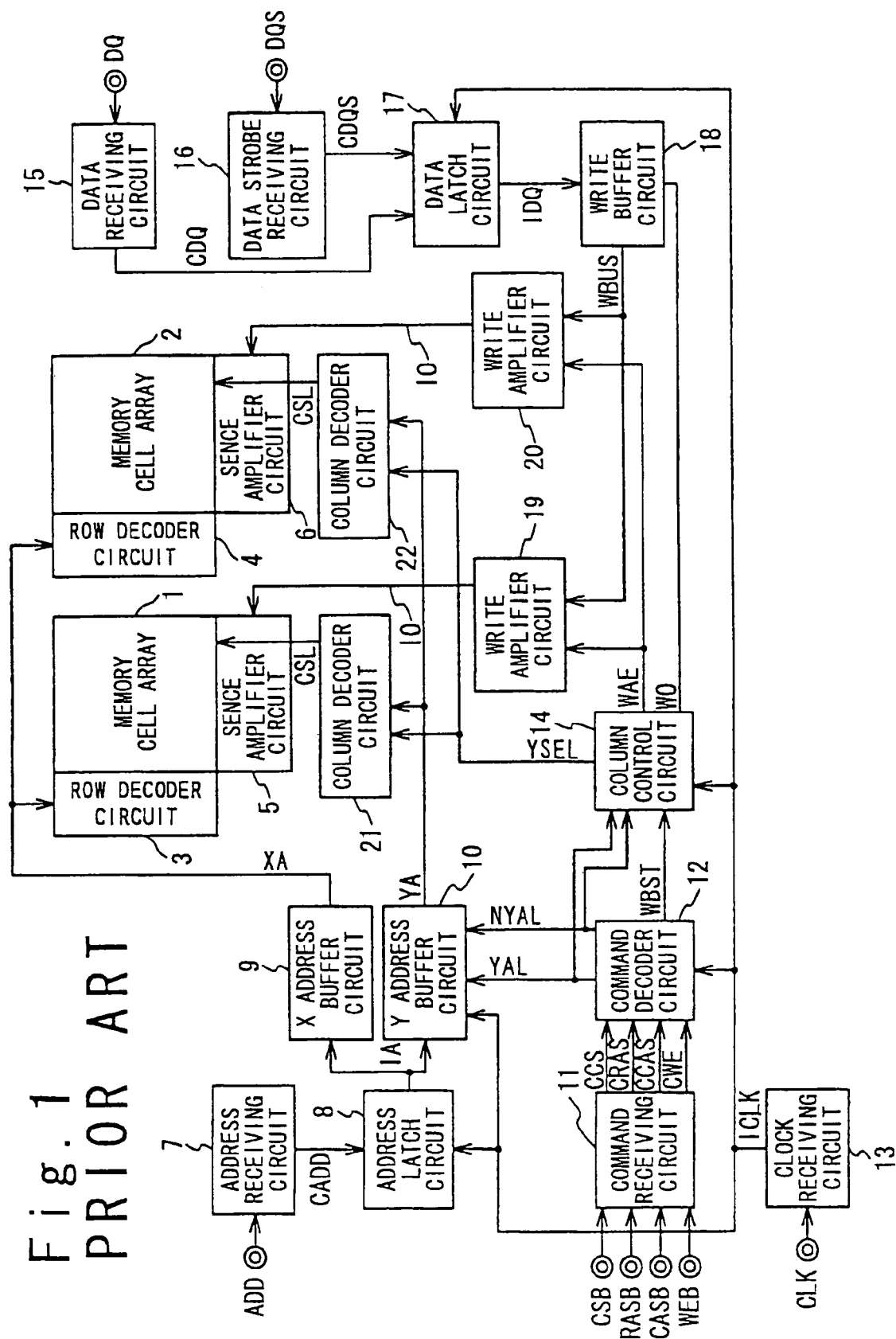
FIG. 1 shows a circuit diagram of the semiconductor memory device of the first conventional example.

In the column address delay operation mode of the semiconductor memory device of the present invention, the read operation is the same as the read operation of the second conventional example of the semiconductor memory device. Namely, the timing that the Y-address buffer control signals YAL and NYAL become active in the read operation is delayed for the time of tDELAY compared with a case of the ordinary operation mode. Because of the delay of the timing that the signal running through the column selection line CSL becomes active state (high level) in the column address delay operation mode, a time of the tAA from the sense amplifier circuits 5 and 6 to DQ PAD is delayed by the time of tDELAY. This is not shown in FIG. 1 and FIG. 2. The tAA indicates the time until all data are outputted to DQ PAD in the same values as expected values from the clock when the read command is inputted. As a result, the data of the sense amplifier circuits 5 and 6 which are activated by the active command are never destroyed by the column selection line CSL which is activated by the read command. The timing that the signal transferred through the column selection line CSL becomes active state (the high level) in the read operation can be made earlier by two clocks than the timing of the write operation. Therefore, the tRCD is rate-controlled by the tRCD of the read operation. The tRCD indicates the time from the clock to which the active command is inputted to the clock to which the column command is inputted.

Furthermore, the tAA of the column address delay operation mode is delayed for the time of tDELAY. On the other hand, it, is possible that the tRCD of the column address delay operation mode is made earlier by the time of tDELAY, comparing with the ordinary operation mode.

As described above, the semiconductor memory device of the present invention has flexibility to use circumstance, such as a data length and a burst length in a DDR-SDRAM in which the 2n-bit pre-fetch method is adopted. Also it is possible to output the timing of the tRCD in the column address delay operation mode earlier, compared with that of the ordinary operation mode, though the tWR is same as that of the ordinary operation mode.

What is claimed is:

1. A semiconductor memory device comprising:
   a plurality of memory cell arrays, each of which include a plurality of memory cells in a matrix;
   a mode control unit which outputs a delay control signal;
   an instruction execution unit which accesses to said plurality of memory cells based on an address and an address buffer control signal supplied externally, said instruction execution unit accesses to said memory cell array based on said address, said address buffer control signal and said command signal; and
   a command control unit which outputs said address buffer control signal to said instruction execution unit based on a command supplied externally and said delay control signal, said command control unit comprises a command decoder circuit which comprises:
   a control unit which inputs said command supplied externally, and outputs said command signal in synchronization with a first clock signal and outputs said address buffer control signal in synchronization with a second clock signal;
   a delay circuit which outputs said address buffer control signal delayed; and
   a multiplexer circuit which selects and outputs one of said address buffer control signal and said address buffer signal delayed by said delay circuit based on said delay control circuit and said command signal to said order execution unit,
   wherein said command control unit outputs said address buffer signal in synchronization with a clock signal when said delay control signal is in an inactive state and said command is a write command or a read command in an ordinary operation mode, and
   when said delay control signal is in an active state and said command is said write command in a write instruction delay operation mode,
   wherein said command control unit outputs said address buffer signal delayed compared with said clock signal when said delay control signal is in the active state and said command is said read command in a read instruction delay operation mode, and
   wherein said command control unit outputs a command signal of the active state in synchronization with said clock signal to said instruction execution unit when said command is said write command and outputs a command signal of the inactive state in synchronization with said clock signal to said instruction execution unit when said command is said read command.

2. The semiconductor memory device according to claim 1, wherein said instruction execution unit write a data based on said address buffer control signal when said command signal is in the active state.

3. The semiconductor memory device according to claim 1, wherein said instruction execution unit reads a data from said address based on said address buffer control signal when said command signal is in the inactive state.

4. A method of a memory access to a plurality of memory cell arrays each of which includes a plurality of memory cells comprising:
   generating a delay control signal;
   generating an address buffer control signal by using a multiplexer circuit which selects and outputs one of said address buffer control signal in synchronization with a clock signal when said delay control signal is in an active state and a command is a write command in a write instruction delay operation mode;
   delaying said address buffer control signal from said clock signal when said delay control signal is in the active state and said command is a read command in a read instruction delay operation mode; and
   accessing to said plurality of memory cell arrays based on an address supplied externally and said address buffer control signal.

5. The method according to claim 4, further comprising:
   generating said address buffer control signal by using a multiplexer circuit which selects and outputs one of said address buffer control signal in synchronization with said clock signal when said delay control signal is in an inactive state and said command is said write command or said read command in an ordinary operation mode.

6. The method according to claim 5, further comprising:
generating said command signal of an active state in synchronization with said clock signal when said command is said write command;
generating said command signal of an inactive state in synchronization with said clock signal when said command is said read command, wherein said accessing includes accessing to said plurality of memory cell arrays based on said address buffer control signal and said command signal.

7. The method according to claim 6, wherein said accessing includes writing a data in said address based on said address buffer control signal when said command signal is in the active state.

8. The method according to claim 6, wherein said accessing includes reading the data from said address based on said address buffer control signal when said command signal is in the inactive state.

* * * * *